United States Patent [19]

Takahashi et al.

[11] Patent Number: 4,606,117
[45] Date of Patent: Aug. 19, 1986

[54] APPARATUS FOR AUTOMATICALLY MOUNTING CHIP TYPE CIRCUIT ELEMENTS ON PRINTED CIRCUIT BOARDS

[75] Inventors: Tetsuo Takahashi; Yoshinobu Taguchi; Tatsuo Umeya, all of Tokyo, Japan

[73] Assignee: TDK Corporation, Tokyo, Japan

[21] Appl. No.: 585,284

[22] Filed: Mar. 1, 1984

[30] Foreign Application Priority Data

May 13, 1983 [JP] Japan ................................. 58-82803
Dec. 26, 1983 [JP] Japan ............................... 58-247073

[51] Int. Cl.$^4$ ............................................. B23P 19/00
[52] U.S. Cl. ........................................ 29/740; 29/759; 29/832; 29/834; 414/223; 414/226
[58] Field of Search ................. 29/759, 740, 832, 834; 414/222, 223, 226

[56] References Cited

U.S. PATENT DOCUMENTS 2,748,388  6/1956  Cardani .............................. 29/566.3
3,382,574  5/1968  Chadwick ............................ 29/613
4,176,441 12/1979  Hafner ............................... 29/566.1
4,298,120 11/1981  Kaneko et al. ....................... 206/329

FOREIGN PATENT DOCUMENTS 13979  8/1980  European Pat. Off. .............. 29/741

Primary Examiner—Howard N. Goldberg
Assistant Examiner—P. W. Echols
Attorney, Agent, or Firm—Frishauf, Holtz, Goodman & Woodward

[57] ABSTRACT

Apparatus for automatically mounting chip type circuit elements on printed circuit boards is constructed in a manner to mount a feed wheel for carrying out the delivery of a chip tape on a lower frame. A lever is mounted with respect to the feed wheel through a one way clutch, so as to allow the lever to be pressed by a cam provided on a reciprocating upper frame which supports a mounting head. The feed wheel is thus rotated in the actuating direction of the one-way clutch to intermittently feed the chip tape and permit another chip type circuit element to be disposed at a chip type circuit element removing position, each time when the mounting head is returned to its original position.

7 Claims, 26 Drawing Figures

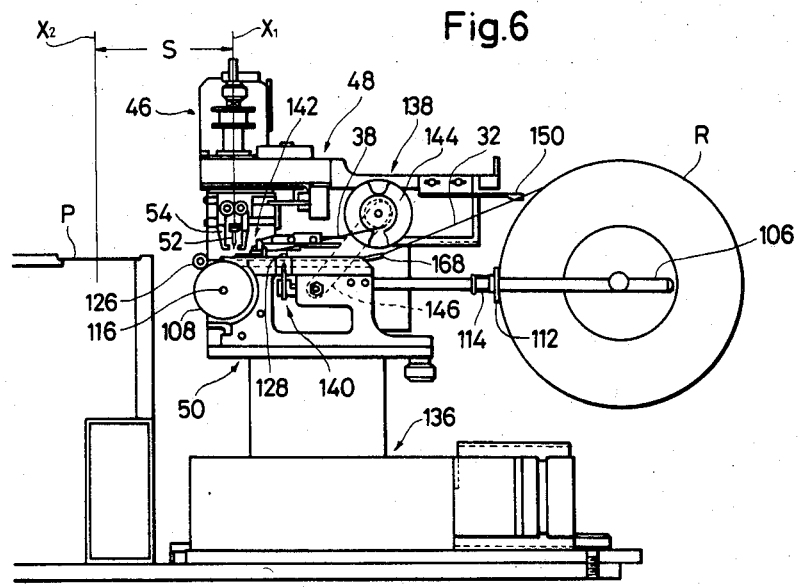
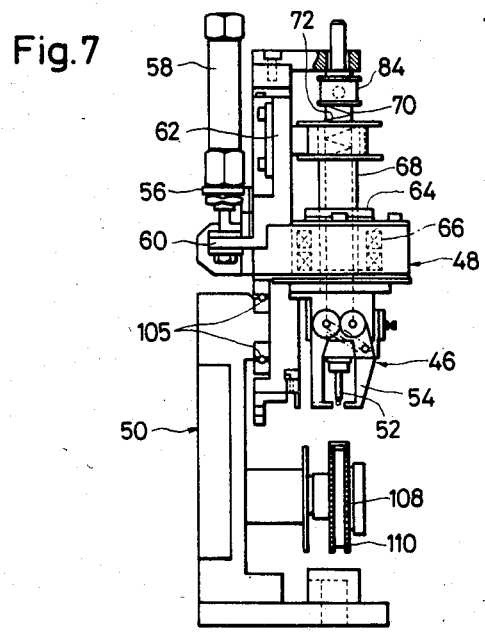

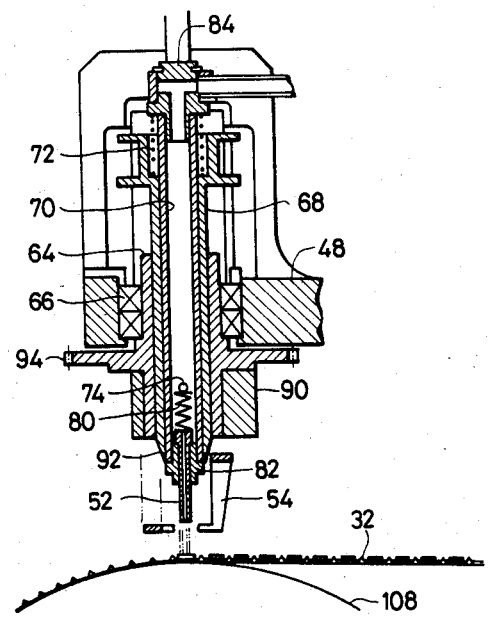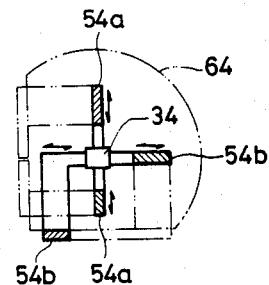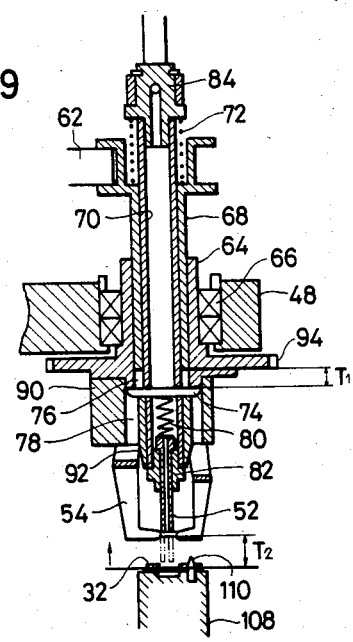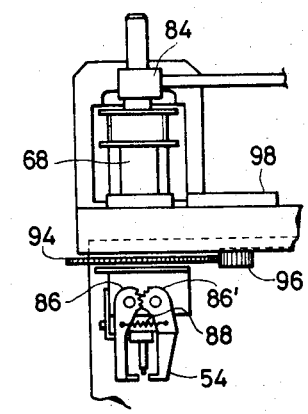

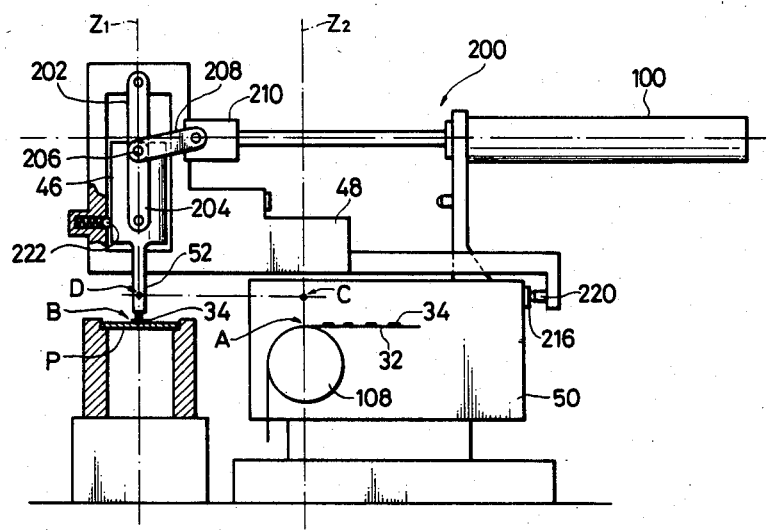
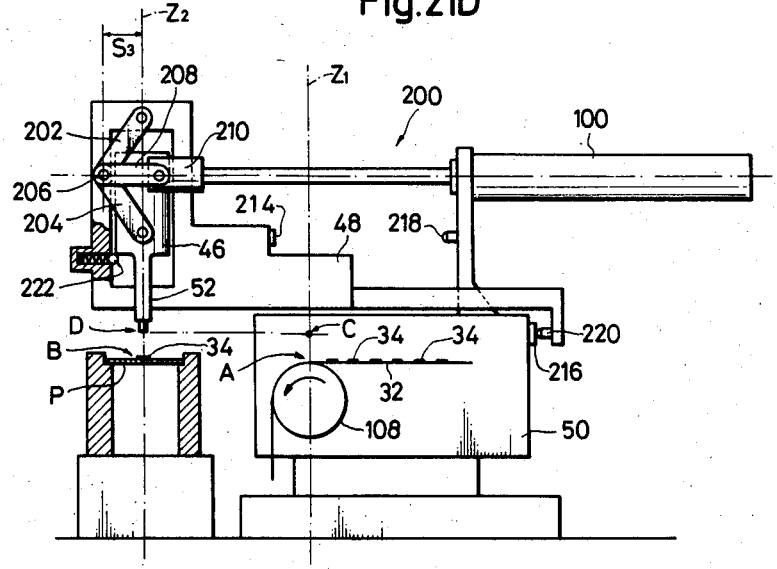

APPARATUS FOR AUTOMATICALLY MOUNTING CHIP TYPE CIRCUIT ELEMENTS ON PRINTED CIRCUIT BOARDS

BACKGROUND OF THE INVENTION

1. Field of the Invention

This invention relates to an apparatus for automatically mounting chip type circuit elements on printed circuit boards, and more particularly to an automatic mounting apparatus for automatically carrying out the removal of individual chip type circuit elements such as condensers, resistors or the like from a tape having the chip type circuit elements held thereon in a manner to be arranged in a row in the longitudinal direction thereof (hereinafter referred to as "chip tape"), and the mounting of one chip type circuit element on each printed circuit board.

2. Description of the Prior Art

An automatic mounting apparatus of such type is generally constructed in a manner to allow a mounting head to individually remove or extract chip type circuit elements from a chip tape and mount the chip type circuit elements on printed circuit boards. However, a conventional automatic mounting apparatus has a disadvantage that the structure is necessarily complicated for the following reasons. First, a mounting head includes a vacuum nozzle for removing a chip type circuit element from a chip tape by suction, and clamping claw means for clamping the chip type circuit element sucked by the vacuum nozzle to mount it on a printed circuit board. Also, the mounting head must be mounted to be vertically movable, because it is required to bring the head to the chip tape and printed circuit boad when a chip type circuit element is sucked by the vacuum nozzle and mounted on the printed circuit board by the clamping claw means. In addition, the mounting head is also required to be horizontally reciprocated between the position at which chip type circuit elements are to be removed from the chip tape (chip type circuit element removing position) and the position at which those are to be mounted on printed circuit boards (chip type circuit element mounting position). Further, the conventional apparatus requires, in addition to the above-mentioned driving mechanism for the mounting head, a driving mechanism for moving an empty chip tape from which chip type circuit elements have been removed to the position at which additional chip type circuit elements are to be charged thereon. Furthermore, the prior art apparatus needs a mechanism for synchronizing such move of the empty chip tape with the return of the mounting head to the position at which the additional chip type circuit elements are to be successively removed from the chip tape.

Thus, it will be noted that the prior art automatic mounting apparatus is substantially complicated in structure, and this results in the manufacturing cost being significantly increased.

BRIEF SUMMARY OF THE INVENTION

The present invention has been made in view of the foregoing disadvantage of the prior art.

An apparatus for automatically mounting chip type circuit elements on printed circuit boards according to the present invention is generally constructed in a manner to mount a feed wheel for carrying out the delivery of a chip tape and the application of tension to a chip tape on a lower frame having the chip tape mounted thereon, and to fit a lever on a shaft of the feed wheel through a one way clutch so as to allow the lever to be pressed by means of a cam provided on a reciprocating upper frame having a mounting head supported thereon, to thereby rotate the feed wheel in the actuating direction of the one-way clutch to intermittently feed the chip tape and permit another chip type circuit element to be disposed at the chip type circuit element extracting position each time the mounting head is returned to the original position.

In accordance with the present invention, there is provided an automatic mounting apparatus comprising a vertically movable mounting head for individually removing chip type circuit elements from a chip tape having said chip type circuit elements held thereon in a manner to be arranged in a row in the longitudinal direction, and mounting said chip type circuit elements on printed circuit boards; an upper frame for longitudinally moving said mounting head between the position at which said chip type circuit elements are to be removed from said chip tape and the position at which said chip type circuit elements are to be mounted on said printed circuit boards; a lower frame for longitudinally movably supporting said upper frame thereon; a feed wheel rotatably mounted through a shaft on said lower frame to carry out the delivery of said chip tape and be rotated in only one direction by means of a one way clutch; a lever means fitted on said shaft of said feed wheel to extend toward said upper frame, said lever means being adapted to be biased in a direction where a torque is not applied; and a cam means provided on said upper frame to abut against and press said lever means; whereby said chip tape is intermittently fed by said feed wheel with the longitudinal movement of said mounting head.

In a preferred embodiment, the upper frame is movably supported on the lower frame to reciprocate between the chip type circuit element removing position and the chip type circuit element mounting position, and the apparatus further comprises two links for connecting said upper frame and said mounting head to each other, said links being pivotally joined together by means of a pivot pin means and adapted to be vertically aligned with each other on a vertical axis when said links fall in line with the chip type circuit element mounting direction; a mechanism for moving said pivot pin in the direction perpendicular to said chip type circuit element mounting direction; the stroke width of said pivot pin moved by said mechanism being larger than that of said upper frame.

Accordingly, it is an object of the present invention to provide an automatic mounting apparatus which is capable of carrying out the removal of a chip type circuit element from a chip tape and the mounting of the chip type circuit element on a printed circuit board with a simple driving mechanism.

It is another object of the present invention to provide an automatic mounting apparatus which is capable of readily coping with the variation in mounting position of a chip type circuit element.

It is another object of the present invention to provide an automatic mounting apparatus which is capable of winding a cover tape of a chip tape to effectively accomplish the chip type circuit element removing and mounting operations.

It is a further object of the present invention to provide an automatic mounting apparatus which is capable of facilitating the extraction of a chip type circuit element from a chip tape.

It is a further object of the present invention to provide an automatic mounting apparatus which is capable of precisely and effectively positioning a chip type circuit element on a chip tape prior to the chip type circuit element removing operation.

It is still a further object of the present invention to provide an automatic mounting apparatus which is capable of carrying out the vertical and horizontal reciprocating movements of a mounting head by means of a single driving mechanism.

The invention accordingly comprises the features of construction, the combination of elements, and arrangement of parts which will be exemplified in construction hereinafter set forth, and the scope of the invention will be indicated in the claims.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference characters designate like or corresponding parts throughout; wherein:

FIG. 6 is a side elevation view generally showing an embodiment of an automatic mounting apparatus according to the present invention;

FIG. 7 is an enlarged front elevation view of a part of the apparatus shown in FIG. 6;

FIGS. 8 and 9 each are an enlarged vertical sectional view showing a mounting head used in the apparatus shown in FIG. 6;

FIG. 10 is a cross sectional view showing a clamping claw means of the mounting head shown in FIGS. 8 and 9;

FIG. 11 is a side elevation view of the clamping claw means shown in FIG. 10;

FIGS. 21A to 21F each are a front elevation view showing the operation of another embodiment of an automatic mounting apparatus according to the present invention.

DETAILED DESCRIPTION OF THE PREFERRED EMBODIMENT

Figure 1:
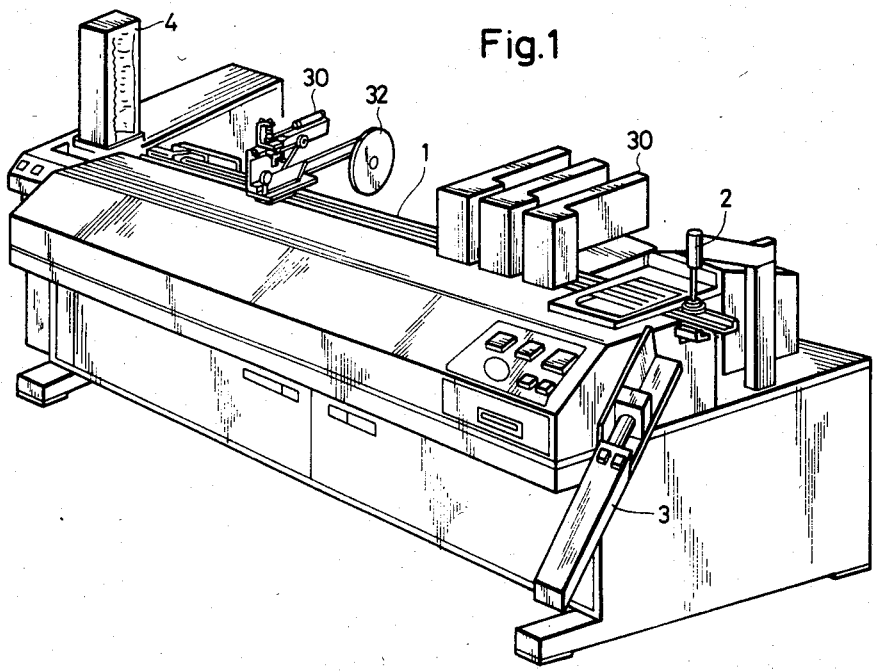
FIG. 1 is a perspective view schematically illustrating one example of a system to which an automatic mounting apparatus of the present invention is applied.

FIG. 1 shows one example of a system to which an automatic mounting apparatus 30 according to the present invention is applied, wherein a plurality of the present automatic mounting apparatus 30 are arranged side by side at predetermined intervals in the direction perpendicular to a conveyor belt 1 for intermittently carrying printed circuit boards. The system shown in FIG. 1 is adapted to put one printed circuit board at a time on the conveyor belt 1 by means of an absorber 2 while pushing up printed circuit boards by means of a loader 3, and automatically remove or extract one chip circuit element at a time from a chip tape by means of the mounting apparatus 30 to mount the chip type circuit element on the predetermined position of a printed circuit board while laterally carrying it by means of the conveyor 1. Thereafter, printed circuit boards on which chip type circuit elements have been mounted are carried to and received in a stockage box 4 by the conveyor 1.

Figure 2:
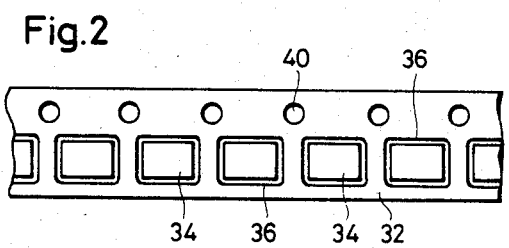
FIG. 2 is a plan view showing a chip tape from which a cover tape has been removed.
Figure 3:
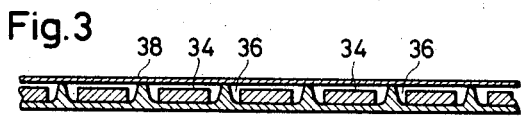
FIGS. 3 and 4 each are a sectional view of the chip tape shown in FIG. 2 having a cover tape mounted thereon.
Figure 4:
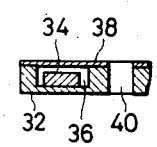
Figure 5:
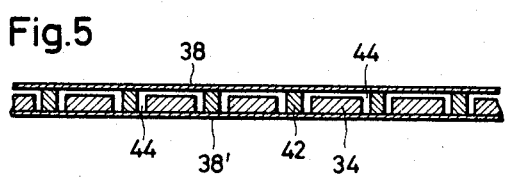
FIG. 5 is a sectional view showing another chip tape suitable for use in the present invention.

FIGS. 2 to 4 show one example of a chip tape 32 having chip type circuit elements 34 such as resistors, condensers, thyristers or the like which are to be mounted on printed circuit boards. The chip type circuit elements 34 are received in recesses 36 formed at the upper surface of the tape 32 and arranged in a row in the longitudinal direction of the tape 32. The chip type circuit elements 34 are covered with a cover tape 38. The tape 32 is provided with a plurality of apertures 40 spaced at predetermined intervals from each other in the longitudinal direction thereof, which are adapted to be engaged with projections or teeth of a feed wheel described hereinafter to smoothly deliver the chip tape. Alternatively, a chip tape 32 shown in FIG. 5 may be used which is constructed in a manner to form a tape body 42 with a plurality of through-holes 44 in which chip type circuit elements are received and cover the tape body 42 with upper and lower cover tapes 38 and 38'.

The automatic mounting apparatus 30 of the present invention for individually removing or extracting chip type circuit elements from the chip tape 32 and mounting them on printed circuit boards, as shown in FIG. 6 illustrating an embodiment of the present invention, generally comprises a mounting head 46 vertically movable to carry out the removal of chip type circuit elements from a chip tape 32 and the mounting of the chip type circuit elements onto printed circuit boards, an upper frame 48 for carrying the mounting head 46 thereon which is reciprocated in the longitudinal direction of the apparatus 30, and a lower frame 50 on which the chip tape 32 is mounted to be intermittently delivered.

The mounting head 46, as shown in FIG. 7, includes a vacuum nozzle 52 acting to remove or extract chip type circuit elements from the chip tape 32 by suction, and a clamping means 54 comprising claws arranged around the vacuum nozzle 52 which acts to clamp a chip type circuit element sucked by the nozzle. The mounting head 46 is securely supported on the upper frame 48 by fixing a cylinder body of the head 46 to a bracket plate 56 of the frame 48, and is vertically moved by an actuating cylinder 58 connected at the lower end of a rod thereof to a projecting plate 60 of a supporting frame 62. The upper frame 48 has fitted therein a sleeve pipe 64, as shown in FIGS. 8 and 9, which is arranged to be rotatable through a bearing means 66 with respect to the frame 48. The sleeve pipe 64 has an outer sliding cylinder 68 fitted therein to be slidable in the axial or vertical direction thereof. In the outer cylinder 68, an inner sliding cylinder 70 is fitted which is forced by a spring 72 to be vertically slidably moved in the vertical direction. Arranged at the lower portion of a cylinder assembly comprising the outer and inner sliding cylinders 68 and 70 is a pin member 72 extending through the assembly in the direction perpendicular to the longitudinal axis of the assembly, which is adapted to be supported by the inner cylinder 70 and vertically moved in slits 76 of the outer cylinder 68. The pin member 74 is received at both ends thereof in slits 78 formed on the inner surface of the sleeve pipe 64 to vertically extend; so that the sleeve pipe 64 may be rotated together with the outer and inner cylinders 68 and 70, and the cylinders 68 and 70 may be vertically moved relative to each other in the sleeve pipe 64 at a distance defined by the slits 76 and 78.

The pin member 74 also serves to support, through a spring 80 mounted on the lower side thereof to downwardly extend therefrom, the vacuum nozzle 52 fitted in a socket 82 provided at the lower end of the inner sliding cylinder 70, utilizing the tension of the spring 80. The vacuum nozzle 52 is connected to a suitable vacuum source (not shown) through the inner sliding cylinder 70 and a joint 84 rotatably fitted in the upper end of the cylinder 70.

The clamping means 54, as shown in FIGS. 10 and 11, comprises two pairs of claws 54a and 54b arranged around the vacuum nozzle 52, wherein the claws of each pair are disposed opposite to each other. The claws 54a or 54b of each pair are provided at the upper portions thereof with gears 86 and 86' meshed with each other and are uniformly opened in the lateral direction by stretching a spring 88 extending therebetween. The so-formed clamping means 54 is pivotally supported on a holder 90 fixed to the sleeve pipe 64. The claws 54a and 54b of the clamping means 54 are adapted to expand when the outer sliding cylinder 68 abuts at the tapered portion 92 formed at the lower end thereof against the shoulder portion of each claw. Also, the clamping means 54 is adapted to be turned by a desired angle through the bearing means 66 by meshing a gear 94 of the sleeve pipe 64 with a pinion 96 of a pulse motor 98 to rotate the gear 94.

In the mounting head 46 constructed in the manner as described above, when the actuating cylinder 58 starts to extend to cause the supporting frame 62 to be downwardly moved, the outer sliding cylinder 68 integrated with the supporting frame 62 is downwardly moved. At this time, the pin member 74 is positioned at or near the lower end of the slit 76 of the outer cylinder 68, thus, the inner sliding member 70 is not downwardly moved at once. Then, when the outer cylinder 68 is downwardly moved within a range of an interval T1 defined by the slit 76, the tapered portion 92 of the outer cylinder 68 abuts against the shoulder of each of the claws to expand the clamping means 54 to the extent sufficient to clamp a chip type circuit element. When the outer sliding cylinder 68 is further downwardly moved to allow the upper end of the slit 76 to abut against the pin member 74, the inner sliding cylinder 70 starts to be downwardly moved together with the outer cylinder 68 to allow the lower end of the vacuum nozzle 52 to be positioned immediately above a chip type circuit element 34 held on the chip tape 32. When the vacuum nozzle 52 further descends by a distance of T2 due to compression of the spring 80 to slightly press the chip type circuit element 34 downwardly and is evacuated through the joint 84 by a vacuum source (not shown), it is permitted to absorb the chip type circuit element 34 by suction. Thereafter, when the actuating cylinder 58 starts to retract, the vacuum nozzle 52 having the chip type circuit element absorbed thereby is upwardly moved together with the cylinders 68 and 70 to extract it from the chip tape 32, during which the outer cylinder 68 is disengaged at the lower tapered portion 92 from the clamping means 54 to allow it to be closed by the springs 88, to thereby hold the chip type circuit element 34 in position and in a proper direction.

Figure 12:
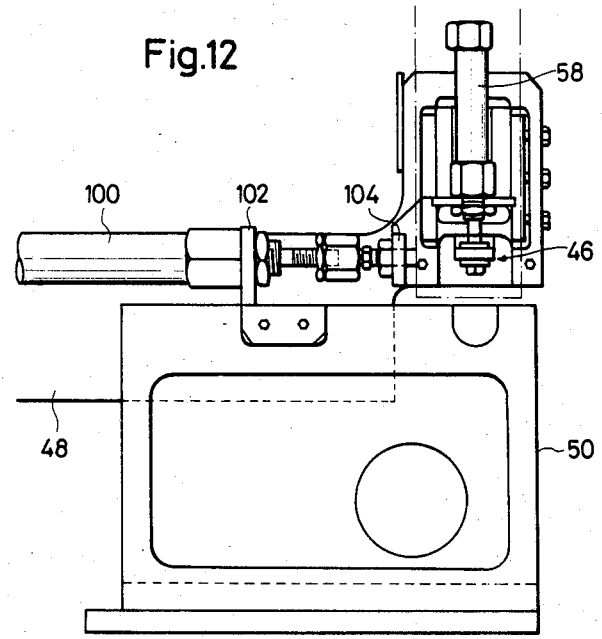
FIG. 12 is a side elevation view showing a mechanism for reciprocating an upper frame.
Figure 13:
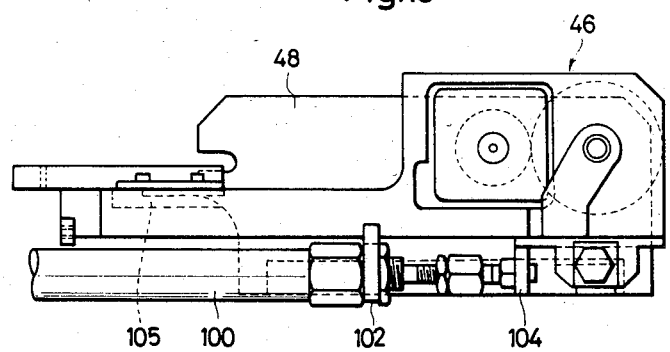
FIG. 13 is a plan view of the mechanism shown in FIG. 12.

The mounting head 46 exhibiting such a function as described above is supported on the upper frame 48 so that it may be reciprocated by a distance S between the position X1 at which a chip type circuit element is to be removed from the chip tape 32 (chip type circuit element removing position) and the position X2 at which the chip type circuit element is to be mounted on a printed circuit board P (chip type circuit element mounting position), as shown in FIG. 6. Such reciprocating motion of the upper frame 48 is accomplished by a driving cylinder 100 which is shown in FIGS. 12 and 13. More particularly, the driving cylinder 100 has a cylinder body mounted through a bracket plate 102 on the lower frame 50 and has a rod fixed at the tip end thereof to a bracket plate 104 by means of a screw. Also, the upper frame 48 is supported on the lower frame 50 to be horizontally reciprocated through slide bearings 105 as shown in FIG. 7.

The chip tape 32 is adapted to be intermittently delivered with the reciprocating motion of the upper frame 48. The tape 32 is wound on a reel R which is supported by a shaft 106 backwardly horizontally extending from the lower frame 50, as shown in FIG. 6. Also, the chip tape 32 is drawn out from the reel R and passed round a feed wheel 108 mounted on the lower frame 50 somewhat beyond the position X1 at which chip type circuit elements are to be removed from the chip tape 32. The feed wheel 108 as shown in FIG. 7, is formed on the outer periphery thereof with a plurality of projections or teeth 110 which are adapted to be engaged with the apertures 40 (FIG. 2) of the chip tape 32. The feed wheel 108 is adapted to be intermittently rotated with the horizontal movement of the upper frame 48 to deliver the chip tape 32, as described hereinafter. The reel R is supported under tension by a stopper 112 (FIGS. 6 and 14) mounted through a spring 114 on the shaft 106, to thereby prevent the chip tape 32 from being delivered from the reel R except when the feed wheel 108 is intermittently rotated.

Figure 14:
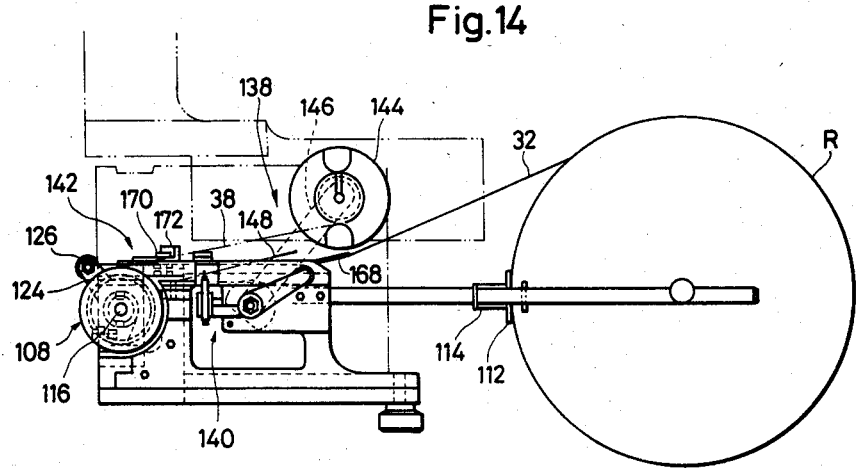
FIG. 14 is a side elevation view showing a chip tape, a cover tape, an ejector pin mechanism and a shutter mechanism mounted on a lower frame.
Figure 15:
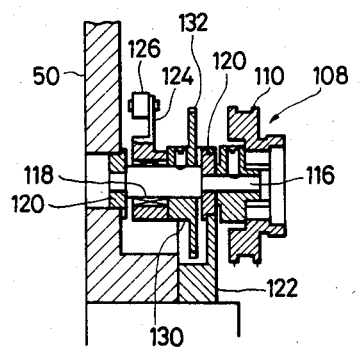
FIG. 15 is a sectional view showing a feed wheel mechanism for delivering a chip tape.
Figure 16:
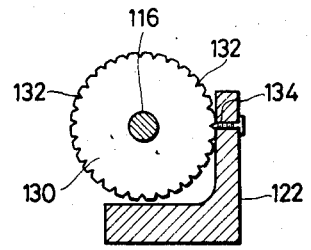
FIG. 16 is a partially broken side view showing a mechanism for positioning an intermittent motion of a feed wheel incorporated in the feed wheel mechanism shown in FIG. 15.

The feed wheel 108, as shown in FIG. 15, is fitted on a shaft 116 supported by the lower frame 50 in a manner such that a one-way clutch 118 allows the feed wheel to transmit a torque in only the direction of feeding the chip tape. The shaft 116 is rotatably supported by bearings 120 interposed between the lower frame 50 and a bracket 122 and has a lever 124 mounted thereon in a manner upwardly project therefrom and obliquely forwardly extend through the one way clutch 118 as shown in FIG. 14. The lever 124 has a roller 126 mounted at the upper end thereof, against which a cam means 128 abuts to permit the one way clutch to rotate the shaft 116 in only the direction of feeding the chip tape. Also, the lever 124 is under tension through a spring (not shown) in the non-rotating direction of the shaft 116, to thereby return to the original position without rotating the shaft 116 when it is disengaged from the cam 128. The shaft 116 is also fitted thereon an index cam 130, which is formed on the periphery thereof with cutouts 132 at intervals corresponding to those of the projections 110 of the feed wheel 108. The cutouts 132 are adapted to selectively engage with a ball plunger 134 to intermittently position the feed wheel 108.

Figure 19:
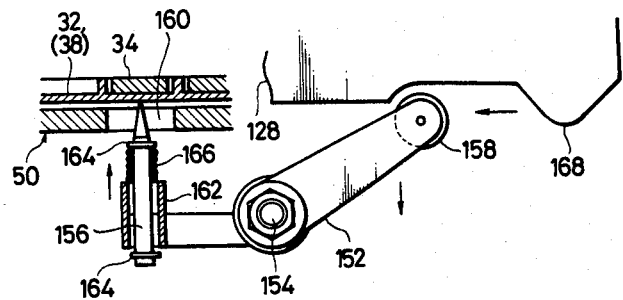
FIG. 19 is an enlarged side view partly in section showing an ejector pin mechanism.

The cam means 128 is provided on the lower side of the upper frame 48 along the direction of feeding the chip tape 32, as shown in FIG. 19. The cam means 128 has a cam surface formed to obliquely downwardly extend in the direction opposite to that of feeding the chip tape 32. The cam means 128 serves to abut against the roller 126 of the lever 124 to downwardly force the lever 124 when the upper frame 48 moves in the forward direction after the mounting head 46 has removed a chip type circuit element from the chip tape 32. When the lever 124 is pivoted downwardly, it rotates the shaft 116 through the one way clutch 118 by a predetermined angle to turn the feed wheel 108. This allows the chip tape 32 to be delivered one pitch at a time. On the contrary, during the return stroke of the upper frame 48, the lever is returned to the original state under tension of the spring; however, the one way clutch is kept free, so that a torque is not transmitted to the shaft 116. Thus, the feed wheel 108 is not turned.

As described hereinbefore, the automatic mounting apparatus 30 is constructed in the manner that when the upper frame 48 is forwardly moved to allow the mounting head 46 to mount a chip type circuit element on a printed circuit board, the cam means 128 abuts against the roller 126 of the lever 124 to intermittently turn the feed wheel 108, to thereby feed the chip tape 32 one pitch at a time. Thus, it will be noted that the apparatus 30 does not need a driving mechanism for the chip tape. Also, when the mounting head 46 is to extract the next chip type circuit element from the chip tape, the portion of the chip tape 32 from which the preceding chip type circuit element has been removed does not remain at the position to which the head returns, because the chip tape is positively delivered one pitch at a time.

The driving cylinder 100 has a stroke of a uniform distance S between the position X1 at which a chip type circuit element is to be removed from the tape 32 (chip type circuit element removing position) and the position X2 at which a chip type circuit element is to be mounted on a printed circuit board (chip type circuit element mounting position). The variation in the position of a printed circuit board on which a chip type circuit element is to be mounted is carried out by positionally adjusting the lower frame 50 by means of an X-Y table means 136 (FIG. 6). The X-Y table means 136 comprises a table for moving the lower frame 50 in the longitudinal direction and a table for moving it in the lateral direction which are superposed on each other.

The embodiment illustrated, as shown in FIG. 6, also includes a mechanism 138 for peeling and winding up the cover tape 38, an ejector pin mechanism 140 for facilitating the extraction of a chip tape circuit element 34 from the recess 36 or through-hole 44 of the chip tape 32, and a shutter mechanism 142 for precisely positioning a chip type circuit element in the recess 36 or through hole 44 prior to the chip type circuit element removing operation. These mechanisms 138, 140 and 142 may be provided to actuate with the reciprocating motion of the upper frame 48.

Figure 17:
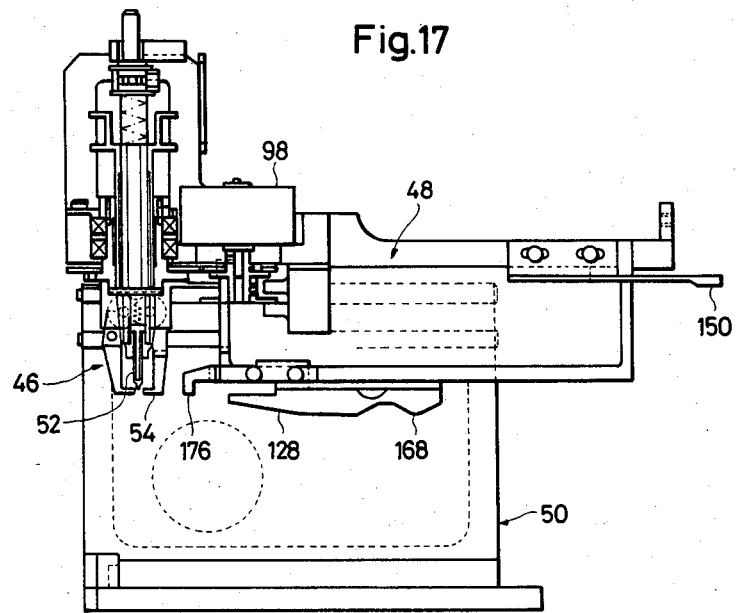
FIG. 17 is a side elevation view showing an intermittent mechanism mounted on an upper frame to carry out the intermittent motion of a feed wheel.

In the illustrated embodiment, the cover tape winding mechanism 138, as shown in FIG. 14, includes a drum 144 rotatably supported on an arm member 146. The drum 144 is adapted to be rotated to pull the cover tape 38 from the vicinity of the feed wheel 108 and wind it therearound. The arm 146 is pivotally supported at the lower end thereof on the lower frame 50. The mechanism 138 also includes a spring 148 provided between the intermediate portion of the arm 146 and the lower frame 50 to pull the arm 146 and a stopper means (not shown) for variably positioning the arm against the spring 148. On the winding mechanism 138, a plate cam 150 acts which is mounted on the upper frame 48 to rearward extend from the rear end of the frame 48 (FIGS. 6 and 17). The plate cam 150 is positioned to slidably contact on a tape winding shaft of the drum 144 and adapted to peel the cover tape and rotate the winding drum 144 to wind the tape around the drum with the forward movement of the upper frame 48. When a large amount of the cover tape is wound around the tape winding shaft of the drum, it is possible to push downward the drum 144 by means of the plate cam 150 while pulling the spring 148.

Figure 18:
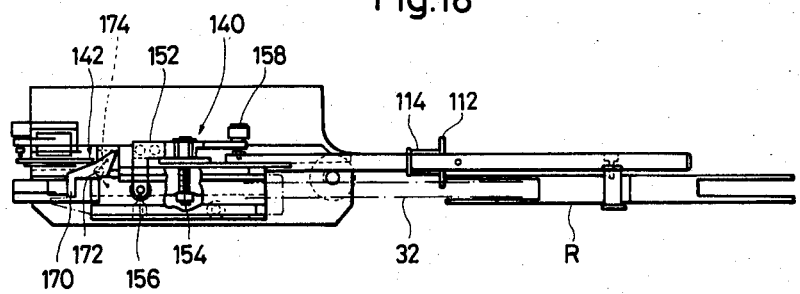
FIG. 18 is a plan view showing a lower frame of the apparatus shown in FIG. 6.

The ejector pin mechanism 140, as shown in FIGS. 14, 18 and 19, includes a lever arm 152 mounted through a shaft 154 on the lower frame 50. The lever arm 152 has an ejector pin 156 upwardly supported on one end thereof and a roller 158 rotatably supported on the other end thereof projecting toward the upper frame 48. The lever arm 152 is biased by, for example, a torsion coil spring (not shown) fitted on the shaft 154 to allow the tip end of the ejector pin 156 to be usually positioned below a opening 160 of a tape feeding face member of the lower frame 50. The ejector pin 156 is inserted in a cylindrical pipe 162 and is formed at the upper and lower portions thereof with collars 164 which act to prevent the pin 156 from being removed from the pipe 162. Also, the ejector pin mechanism 140 includes a spring 166 fitted on the ejector pin 156 between the upper collar 164 and the cylindrical pipe 162 to vertically bias the ejector pin 156. The ejector pin mechanism 140 of such construction is actuated by a cam 168 formed in a manner to be joined to the cam means 128 (FIGS. 6, 17 and 19). The cam 168 is adapted to abut against the roller 158 of the lever arm 152 to upward move the ejector pin 156 about the shaft 154, to thereby allow the pin 156 to upward push a chip type circuit element 34 through the chip tape 32 or the cover tape 38'. Such ejecting operation is carried out before the vacuum nozzle 52 of the mounting head 46 extracts a chip type circuit element by suction, so that the removal of a chip type circuit element by the nozzle 52 may be more smoothly and positively carried out.

Figure 20:
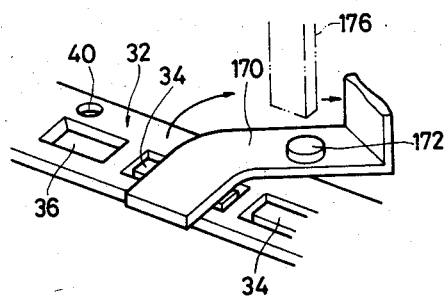
FIG. 20 is a perspective view showing a shutter mechanism.

The shutter mechanism 142, as shown in FIG. 20, is constructed in such a manner to support a shutter member 170 comprising a plate of a substantially dog-legged shape through a pin 172 on the tape feeding face member of the lower frame 50 and interpose a torsion coil spring 174 (FIG. 18) fitted on the pin 172 between the shutter 170 and the lower frame 50, so that it may be constantly positioned above the upper surface of the chip tape 32. The shutter mechanism 142 serves to prevent a chip type circuit element 34 from coming off from or shifting in the chip tape when the cover tape 38 is peeled from the chip tape. Member 176 (FIGS. 17 and 20) is an arm of an inverted L shape mounted at the front end portion of the upper frame 48, which acts on the shutter member 170 in a manner to allow the shutter member 170 to be withdrawn from a chip tape feed path against the torsion coil spring 174 when the upper frame 48 returns to the original position to permit the vacuum nozzle 52 to be positioned right above a chip type circuit element to be removed.

The illustrated embodiment, as described above, is constructed to vertically move the mounting head 46 and horizontally move the upper frame 48 because printed circuit boards are adapted to be horizontally fed by the conveyor belt 1. However, when printed circuit boards are vertically or obliquely fed, it is of course possible that the direction in which each of the mounting head and upper frame is moved can be varied accordingly.

As can be seen from the foregoing, the illustrated embodiment carries out the intermittent delivery of a chip tape utilizing the reciprocating movement of the upper frame without providing a specific driving means, to thereby allow the construction to be simplified. Also, the delivery of a chip tape and the extraction of a chip type circuit element by the mounting head are accomplished in relation to each other, resulting in the mounting operation being positively accomplished.

FIGS. 21A to 21F illustrate another embodiment of an automatic mounting apparatus according to the present invention which further includes a single driving mechanism 200 for carrying out both the vertical reciprocating movement of a mounting head for mounting a chip type circuit element on a printed circuit board, and the horizontal reciprocating movement of the mounting head between the position at which a chip type circuit element is to be removed from a chip tape (chip type circuit element removing position) and the position at which a chip type circuit element is to be mounted on a printed circuit board (chip type circuit element mounting position). Also, the illustrated embodiment includes a lower frame 50, tables 136X and 136Y for respectively moving the lower frame 50 in the X and Y directions, an upper frame 48 mounted on the lower frame 50 to carry out the reciprocating movement in the longitudinal direction, and a mounting head 46 mounted on the upper frame 48.

Figure 21A:
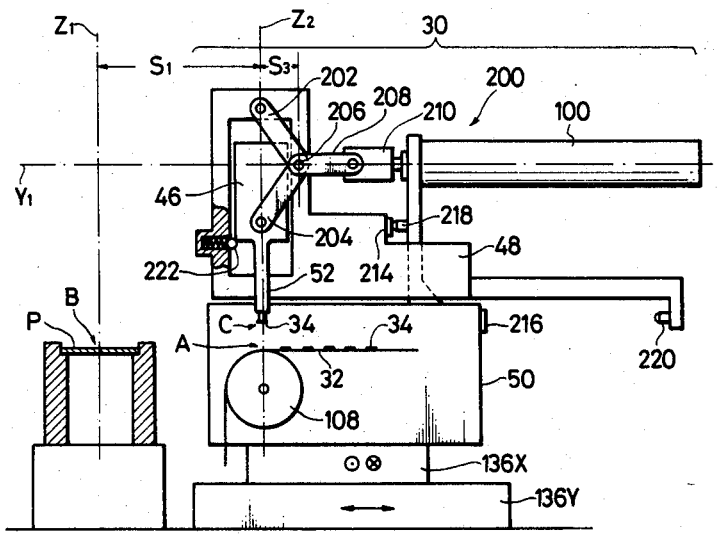

The single driving mechanism 200, as shown in FIG. 21A, includes two links 202 and 204 joined to each other by means of a pivot pin 206. The links 202 and 204 are pivotally connected at the other ends thereof to the upper frame 48 and the mounting head 46, respectively, to thereby connect the upper frame and mounting head to each other therethrough. The links 202 and 204 are adapted to be vertically aligned with each other on a vertical axis when the mounting head 46 is moved to the position at which a chip type circuit element 34 is to be mounted on a chip tape 32.

The mechanism 200 also includes a link 208 which is pivotally fitted at one end thereof on the pivot pin 206 and pivotally connected at the other end thereof to a rod 210 of a cylinder 100 fixed on the lower frame 50. The cylinder 100 is adapted to reciprocate the rod 210 to move the pivot pin 206 in the longitudinal direction. The movement of the pivot pin 206 may be an arcuate movement caused due to the rocking motion of the link 202. The lower frame 50 is provided with stoppers 218 and 216 against which projections 214 and 220 provided on the upper frame abut to define the stroke width of the upper frame 48, respectively. More particularly, the stroke width of the frame 48 is determined so that the right limit corresponds to the vertical axis Z2 of the chip type circuit element removing position A of a vacuum nozzle 52 of the mounting head 46 and the left limit corresponds to the vertical axis Z1 of the chip type circuit element mounting position B of the nozzle 52. Thus, the stroke width S1 is equal to the distance between the axis Z1 and the axis Z2. The stroke width S2 of the cylinder 100 is determined to be larger than the stroke width S1 of the upper frame. In the embodiment, the stroke width S2 is preferably determined to meet the following equation:

$$S2 = S1 + 2S3$$

wherein S3 is the distance between the pivot pin 206 and the axis Z2 in FIG. 21A.

The embodiment illustrated further includes a means 222 for controlling the downward movement of the mounting head 46. The control means 222 comprises a ball plunger provided at the upper frame adjacent to the head, and acts to prevent the downward movement of the head 46 when a downward force applied to the head is at a predetermined level or less, and allow such movement when the force is above the level. Also, the means 222 serves to prevent the downward movement of the mounting head when the pivot pin 206 is at the position shown in FIG. 21A.

It is a matter of course that the present invention does not require an actuating cylinder corresponding to the cylinder 58 in the first embodiment.

The manner of operation of the present embodiment will be described hereinafter with reference to FIGS. 21A to 21F.

First, in FIG. 21A, the apparatus 30 is in a state that a chip type circuit element 34 is removed from a chip tape 32 at the chip type circuit element removing position A by the vacuum nozzle 52 and upwardly drawn to a position C along the axis Z2. In the embodiment, the chip type circuit element mounting position B on the axis Z1 is at the center of a printed circuit board P, and each of the tables 136X and 136Y is at the neutral position.

Then, when the cylinder 100 is actuated, the pivot pin 206 is forward moved through the rod 210 and link 208. At this time, the control means 222 prevents the links 202 and 204 from moving downward the mounting head 46. Thus, the force of the control means 222 overcomes the moving force of the upper frame 48 to cause the pivot pin 206 to be pushed while keeping the distance S3, resulting in the upper frame 48 being moved forward.

Figure 21B:
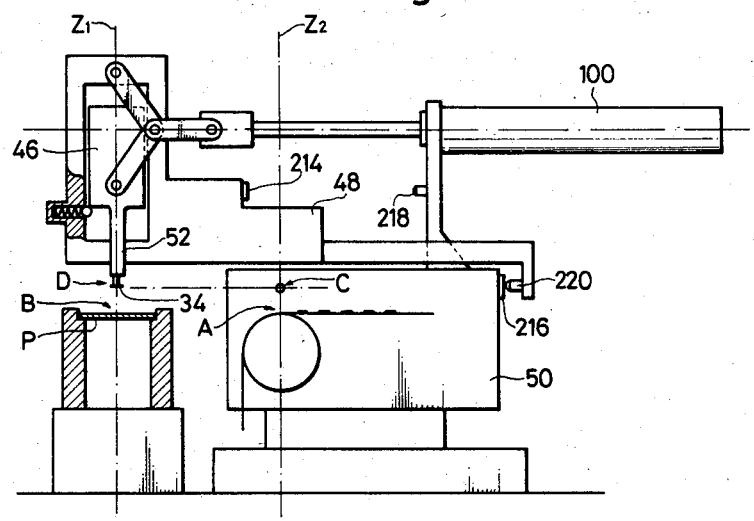
Figure 21E:
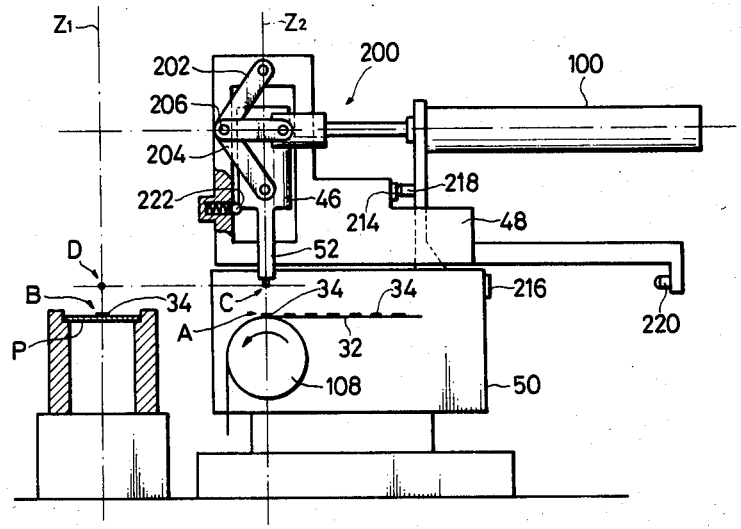

When the vacuum nozzle is right above the chip type circuit element mounting position B on the axis Z1 as shown in FIG. 21B, the projection 220 abuts against the stopper 216 to stop the upper frame 48. A further actuation of the cylinder 100 forward forces the pivot pin 206 through the rod 210 and link 208, so that the link 202 allows the pin 206 to accomplish an arcuate motion to move downward the mounting head 46 through the link 204. More particularly, a downward force overcoming the holding force of the control means 222 is applied to the mounting head 46 to move downward the head 46, because the projection 220 abuts against the stopper 216 to stop the movement of the upper frame 48. Further, when the links 202 and 204 are vertically aligned with each other on the axis Z1, as shown in FIG. 21C, the chip type circuit element 34 held on the vacuum nozzle 52 reaches the lowermost position or chip type circuit element mounting position B and is mounted on the printed circuit board P by means of a suitable adhesive.

Subsequently, when a vacuum is released from the vacuum nozzle 52 and the cylinder 100 is actuated, the pivot pin 206 is further moved forward to the links 202 and 204 to upward move the mounting head 46 and vacuum nozzle 52. When the pivot pin 206 reaches the position spaced by the distance S3 forward from the vacuum nozzle 52 at the left limit of the cylinder 100, the actuation of the cylinder 100 is stopped to allow the lower end of the nozzle 52 to return to the position D. The mounting head 46 is restrained by the control means 222 again.

Then, when the cylinder 100 starts to be contracted, the upper frame 48 is moved backward keeping the relative position between the links 202, 204 and the pivot pin 206 because the force of the control means 222 is larger than the moving force of the cylinder 100. During the movement of the cylinder 100, a feed wheel 108 is rotated to deliver the chip tape 32 one pitch to feed another chip type circuit element to the chip type circuit element removing position A. When the cylinder 100 is further contracted to allow the vacuum nozzle 52 to be right above the chip type circuit element removing position A on the axis Z2, the projection 214 abuts against the stopper 218 to stop the upper frame 48. At this time, the lower end of the vacuum nozzle 52 is returned to the position C.

Figure 21F:
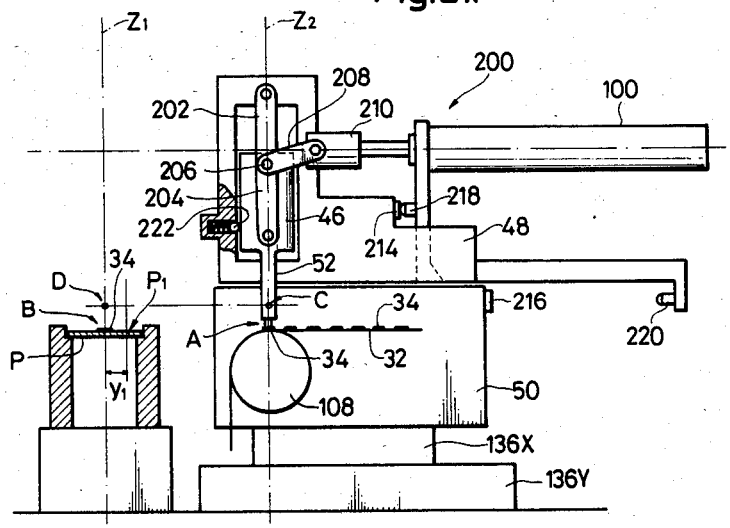

The further contraction of the cylinder 100 permits the links 202 and 204 to act to downward move the mounting head 46 against the holding force of the control means 222, so that the links 202 and 204 are vertically aligned together on the axis Z2 to allow the lower end of the vacuum nozzle 52 to reach the chip type circuit element removing position A to remove another chip type circuit element from the chip tape 32 by suction, as shown in FIG. 21F. When the cylinder 100 is still further contracted to the right limit of the stroke; the pivot pin 206 is backward moved from the axis Z2 to upward move the mounting head 46 and vacuum nozzle 52, resulting in the single driving mechanism being returned to the state shown in FIG. 21A.

It will thus be seen that the objects set forth above, and those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an apparatus for automatically mounting chip type circuit elements on printed circuit boards, including a vertically movable mounting head for individually removing chip type circuit elements from a chip tape having said chip type circuit elements held thereon in a row in the longitudinal direction of said chip tape, and for mounting said chip type circuit elements on said printed circuit boards, and a mechanism for winding up a cover tape of said chip tape, the improvement comprising:

an upper frame for longitudinally moving said mounting head between a position at which said chip type circuit elements are to be removed from said chip tape and a position at which said chip type circuit elements are to be mounted on said printed circuit boards;

a lower frame for longitudinally movably supporting said upper frame thereon;

a feed wheel rotatably mounted on a shaft on said lower frame at a position for forward delivery of said chip tape to carry out the delivery of said chip tape and for rotation in only one direction, and a one way clutch on said shaft for driving said feed wheel in only said one direction;

lever means pivotally mounted on said shaft of said feed wheel to extend toward said upper frame, said lever means being connected to said one way clutch and including means for biasing said lever means in a direction opposite said one direction; and cam means provided on said upper frame operatively to abut against and press said lever means to cause said feed wheel to rotate in said one direction;

wherein said chip tape is intermittently fed by said feed wheel in response to successive longitudinal movements of said mounting head on said upper frame relative to said lower frame.

2. An automatic mounting apparatus as defined in claim 1, wherein the vertical movement of said mounting head is accomplished by first actuating means, and the longitudinal movement of said mounting head is carried out by second actuating means.

3. An automatic mounting apparatus as defined in claim 1, wherein the intermittent delivery of said chip tape is carried out every forward movement of said upper frame.

4. An automatic mounting apparatus as defined in claim 1 further comprising X-Y table means for adjusting the longitudinal and lateral positions of said upper frame.

5. An automatic mounting apparatus as defined in claim 1 further comprising an ejector pin mechanism for facilitating the removal of said chip type circuit elements from said chip tape.

6. An automatic mounting apparatus as defined in claim 1 further comprising a shutter mechanism for precisely and positively positioning said chip type circuit elements on said chip tape prior to the chip type circuit element mounting operation.

7. An automatic mounting apparatus as defined in claim 1, wherein said upper frame is movably supported on said lower frame to reciprocate between the chip type circuit element extracting position and the chip type circuit element mounting position; and further comprising:

two elongate links for connecting said upper frame and said mounting head to each other, said links being pivotally joined together by pivot means and being longitudinally aligned with each other when said links fall in line with the chip type circuit element mounting direction and the chip type circuit element removing direction;

a mechanism for moving said pivot means in the direction substantially perpendicular to said chip type circuit element mounting direction;

the stroke width of said pivot means moved by said mechanism being larger than that of said upper frame so that said pivot means may be moved between both sides of said vertical axis defined by said links when said links are vertically aligned with each other.

* * * * *